United States Patent
Koo et al.

(10) Patent No.: US 10,010,065 B2
(45) Date of Patent: Jul. 3, 2018

(54) INSECT TRAP USING UV LED LAMP

(71) Applicant: Seoul Viosys Co., Ltd., Ansan-si (KR)

(72) Inventors: Jong Hyun Koo, Ansan-si (KR); Hyun Su Song, Ansan-si (KR); Dong-Kyu Lee, Busan (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/788,183

(22) Filed: Oct. 19, 2017

(65) Prior Publication Data

US 2018/0035659 A1  Feb. 8, 2018

Related U.S. Application Data

(63) Continuation of application No. 15/630,903, filed on Jun. 22, 2017, now Pat. No. 9,832,986, which is a continuation of application No. 14/490,533, filed on Sep. 18, 2014, now Pat. No. 9,706,764, which is a continuation-in-part of application No. 14/478,937, filed on Sep. 5, 2014, now Pat. No. 9,717,228.

(60) Provisional application No. 62/028,383, filed on Jul. 24, 2014.

(51) Int. Cl.
*A01M 1/08* (2006.01)
*A01M 1/10* (2006.01)
*H01L 33/26* (2010.01)
*H01L 33/32* (2010.01)
*H01L 33/06* (2010.01)

(52) U.S. Cl.
CPC .............. *A01M 1/08* (2013.01); *A01M 1/106* (2013.01); *H01L 33/06* (2013.01); *H01L 33/26* (2013.01); *H01L 33/32* (2013.01)

(58) Field of Classification Search
CPC ........................................................ A01M 1/08
See application file for complete search history.

(56) References Cited

U.S. PATENT DOCUMENTS

| | | |
|---|---|---|
| 5,255,468 A | 10/1993 | Cheshire et al. |
| 2002/0070681 A1 | 6/2002 | Shimizu |
| 2003/0041506 A1 | 3/2003 | Coventry |
| 2004/0068917 A1 | 4/2004 | Chan |
| 2005/0060926 A1 | 3/2005 | Lee |
| 2009/0045392 A1 | 2/2009 | Park |
| 2009/0094883 A1 | 4/2009 | Child |
| 2009/0156905 A1 | 6/2009 | Riles |
| 2009/0277074 A1 | 11/2009 | Noronha |
| 2009/0288333 A1 | 11/2009 | Johnston |
| 2011/0030266 A1 | 2/2011 | Roy |
| 2011/0296740 A1 | 12/2011 | Yamada |
| 2013/0292685 A1 | 11/2013 | Jiang |

(Continued)

OTHER PUBLICATIONS

First Office Action in Chinese Patent Application No. 201510440994.3, dated Aug. 14, 2017.

*Primary Examiner* — Gary C Hoge
(74) *Attorney, Agent, or Firm* — Perkins Coie LLP

(57) ABSTRACT

The present document relates to an insect trap using an ultraviolet light-emitting diode (UV LED) lamp, and more particularly, to an insect trap using, in place of a conventional UV light source lamp, a UV LED lamp that significantly increases the insect trapping efficiency. One example implementation of the insect trap includes: a UV LED lamp disposed in an air inlet portion of the duct, and including a printed circuit board (PCB) that has a UV LED chip mounted thereon; an installing portion for installing the UV LED lamp on; and a trapping portion provided near the installing portion.

16 Claims, 6 Drawing Sheets

(56) References Cited

U.S. PATENT DOCUMENTS

2014/0137462 A1    5/2014   Rocha
2014/0165452 A1    6/2014   Rocha
2014/0209946 A1    7/2014   Chou
2014/0332754 A1   11/2014   Zhang

INSECT TRAP USING UV LED LAMP

CROSS-REFERENCE TO RELATED APPLICATION(S)

The present application is a continuation of U.S. patent application Ser. No. 15/630,903, filed Jun. 22, 2018, which is a continuation of U.S. patent application Ser. No. 14/490,533, now U.S. Pat. No. 9,706,764, which is a continuation-in-part of U.S. patent application Ser. No. 14/478,937, filed Sep. 5, 2014, now U.S. Pat. No. 9,717,228, which claims the benefit of U.S. Provisional Patent Application No. 62/028,383, filed Jul. 24, 2014. The above patent documents are incorporated herein by reference for all purposes.

BACKGROUND

1. Technical Field

The present disclosure relates to an insect trap using an ultraviolet light-emitting diode (UV LED) lamp, and more particularly, to an insect trap using, in place of a conventional UV light source lamp, a UV LE D lamp that significantly increases the insect trapping efficiency.

2. Related Art

UV light sources have been used for medical purposes such as sterilization, disinfection and the like, the purpose of analysis based on changes in irradiated UV light, industrial purposes such as UV curing, cosmetic purposes such as UV tanning, and other purposes such as insect trapping, counterfeit money discrimination and the like.

Conventional UV light source lamps that are used as such UV light sources include mercury lamps, excimer lamps, deuterium lamps and the like. However, such conventional lamps all have problems in that the power consumption and heat generation are high, the life span is short, and toxic gas filled therein causes environmental pollution.

As an alternative to overcome the above-described problems of the UV light source lamps, UV LEDs have attracted attention. UV LEDs are advantageous in that they have low power consumption and cause no environmental pollution. However, the production cost of LED packages that emit light in the UV range is considerably higher than the production cost of LED packages that emit light in the visible range, and various products using UV LED packages have not been developed since the characteristics of UV light is quite different from the characteristics of light in the visible range.

In addition, even when a UV LED is applied to a conventional UV light source lamp product instead of the UV light source lamp, the conventional UV light source lamp product does not exhibit its effect in many cases, because the light-emission characteristics of the UV LED differ from those of the conventional UV light source lamp.

For example, in the case of an insect trap, the characteristics of UV light have a great effect on the attraction of insects. For this reason, if a UV lamp in a conventional insect trap is simply replaced with a UV LED, there is a problem in that the insect trapping effect can decrease rather than increase.

SUMMARY

Various embodiments are directed to an insect trap using, in place of a conventional UV lamp, a UV LED lamp that increases the insect trapping efficiency.

In an embodiment, an insect trap may include: a duct including a suction fan herein; a UV LED lamp disposed in an air inlet portion of the duct, and including a printed circuit board (PCB) that has a UV LED chip mounted thereon; an installing portion for installing the UV ED lamp on; and a trapping portion provided near the installing portion.

A plurality of UV LED chips may be mounted on the PCB, and may emit UV light having a peak value of substantially the same wavelength.

UV light that is emitted from the UV LED chip may have a peak wavelength of 335-395 nm.

UV light that is emitted from the UV LED chip may have a peak wavelength of 360-370 nm.

UV light that is emitted from the UV LED chip may have a diffusion angle of 120° or less.

The UV LED lamp may have a $\varphi e/\varphi v$ value of 98 or more, wherein $\varphi e$ represents radiant flux having units of mW, and $\varphi v$ has units of lm.

UV light that is emitted from the UV LED lamp has a spectrum half-width of 14.5 nm or less. Spectrum half-width is also called spectral line half-width.

Transparent housing made of a material that allows UV light to readily pass therethrough may be provided at the UV LED chip side of the UV LED lamp, wherein the surface of the transparent housing may be roughend.

The roughened surface may be formed by sand blast process.

The radiant flux of the UV LED lamp may be 750 mW to 1500 mW.

UV light emitted from the chips of the UV LED lamp may be directed upwardly or laterally from the insect trap.

The UV LED chip includes: an n-type contact layer including an AlGaN layer or an AlInGaN layer; a p-type contact layer including an AlGaN layer or an AlInGaN layer; an active region having a multiple quantum well structure, located between the n-type contact layer and the p-type contact layer; and at least one electron control layer located between the n-type contact layer and the active region. Also, the active region having the multiple quantum well structure may include barrier layers and well layers, the barrier layers may be formed of AlInGaN or AlGaN, and a first barrier layer located closest to the n-type contact layer may have an Al content higher than those of other barrier layers. Meanwhile, the electron control layer is formed of AlInGaN or AlGaN, and has an Al content higher than those of layers adjacent thereto so as to interfere with the flow of electrons moving into the active region. This may reduce the mobility of electrons, thereby increasing the recombination rate of electrons and holes in the active region.

In particular, the first barrier layer may also be formed so as to interfere with the flow of electrons, and thus the flow of electrons may be effectively delayed by the first barrier layer and the electron control layer.

Herein, the well layers may be formed of InGaN.

Meanwhile, when the barrier layers contain indium (In), the lattice mismatch between the well layers and the barrier layers may be reduced, thereby improving the crystal quality of the well layers.

The first barrier layer located closest to the n-type contact layer may have an Al content that is higher than those of other barrier layers by at least 5%, at least 10% or at least 20%. In some embodiments, the first barrier layer located closest to the n-type contact layer may have an Al content of 30-50%.

In the specification, the content of each metal element is expressed as the percentage of the content of each metal element relative to the sum of the contents of metal elements in a gallium nitride-based layer. In other words, the content of Al in a gallium nitride-based layer represented by $Al_xIn_yGa_zN$ is expressed as a percentage (%) according to the equation $100xx/(x+y+z)$. Generally, the sum of x, y and z is 1 (x+y+z=1), and thus the percentage of each metal element generally corresponds to a value obtained by multiplying the composition ratio (x, y or z) by 100.

Meanwhile, barrier layers other than the first barrier layer may be formed of an AlInGaN or AlGaN having an Al content of 10-30% and an In content of 1% or less.

In an embodiment, the first barrier layer may be formed of an AlInGaN having an In content of 1% or less.

In some embodiments, the p-type contact layer may include a lower high-concentration doped layer, an upper high-concentration doped layer, and a low-concentration doped layer located between the lower high-concentration doped layer and the upper high-concentration doped layer. Also, the low-concentration doped layer has a thickness greater than those of the lower and upper high-concentration doped layers. When the low-concentration doped layer is formed to have a relatively thick thickness, the absorption of light by the p-type contact layer may be prevented.

In addition, the n-type contact layer may include a lower aluminum gallium nitride layer, an upper aluminum gallium nitride layer, and a multilayered intermediate layer located between the lower aluminum gallium nitride layer and the upper aluminum gallium nitride layer. When the multilayered intermediate layer is disposed in the intermediate portion of the n-type contact layer, the crystal quality of epitaxial layers that are formed on the n-type contact layer may be improved. Particularly, the multilayered intermediate layer may have a structure formed by alternately depositing AlInN and GaN.

The n-type contact layer may include a modulation-doped AlGaN layer. The upper aluminum gallium nitride layer may be a modulation-doped layer.

Meanwhile, the UV LED chip may further include: a superlattice layer located between the n-type contact layer and the active region; and an electron injection layer located between the superlattice layer and the active region. The electron injection layer may have an n-type impurity doping concentration higher than half of the superlattice layer, and the first barrier layer may come into contact with the electron injection layer. When the first barrier layer is disposed so as to come into contact with the electron injection layer having a relatively high n-type impurity doping concentration, the flow of electrons may effectively be delayed.

In addition, the UV LED chip may further include electrostatic discharge preventing layer located between the n-type contact layer and the superlattice layer, and a first electron control layer may be disposed between the electrostatic discharge preventing layer and the superlattice layer. The electrostatic discharge preventing layer functions to prevent electrostatic discharge by restoring crystal quality reduced by doping of an impurity into the n-type contact layer including AlGaN or AlInGaN.

In some embodiments, the electrostatic discharge preventing layer may include: an undoped AlGaN layer; a low-concentration AlGaN layer doped with an n-type impurity at a concentration lower than that of the n-type contact layer; and a high-concentration AlGaN layer doped with an n-type impurity at a concentration higher than that of the low-concentration AlGaN layer, in which the low-concentration AlGaN layer may be located between the undoped AlGaN layer and the high-concentration AlGaN layer. The undoped AlGaN layer functions to restore crystal quality, and the crystal quality of layers being grown thereon is maintained by slowly increasing the doping concentration. In addition, the first electron control layer may come into contact with the high-concentration AlGaN layer. When the first electron control layer is disposed so as to come into contact with the high-concentration AlGaN layer, the flow of electrons may be effectively delayed.

The n-type contact layer and the superlattice layer may have an Al content of less than 10%, and the first electron control layer may have an Al content of 10-20%.

Meanwhile, a second electron contact layer may be located between the n-type contact layer and the electrostatic discharge preventing layer. In addition, the n-type contact layer and the electrostatic discharge preventing layer may have an Al content of less than 10%, and the second electron control layer may have an Al content of 10-20%.

DETAILED DESCRIPTION

Figure 1:
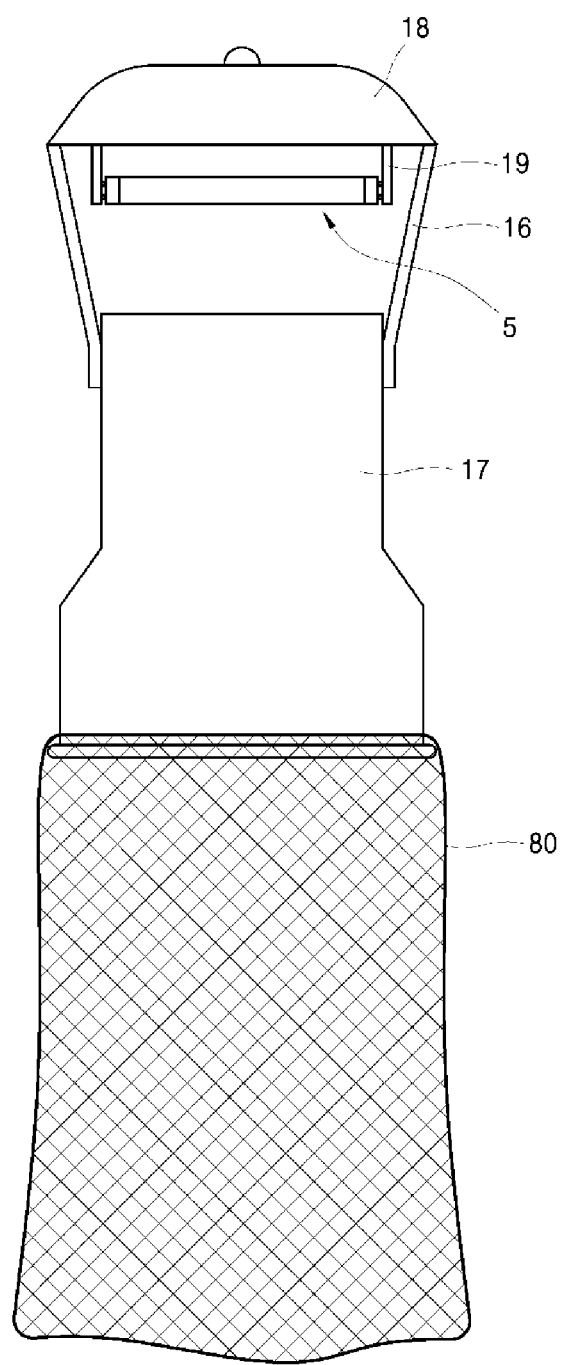
FIG. 1 is a side view of an insect trap according to the first embodiment of the present disclosure.

Exemplary embodiments will be described below in more detail with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

1st Embodiment

Figure 2:
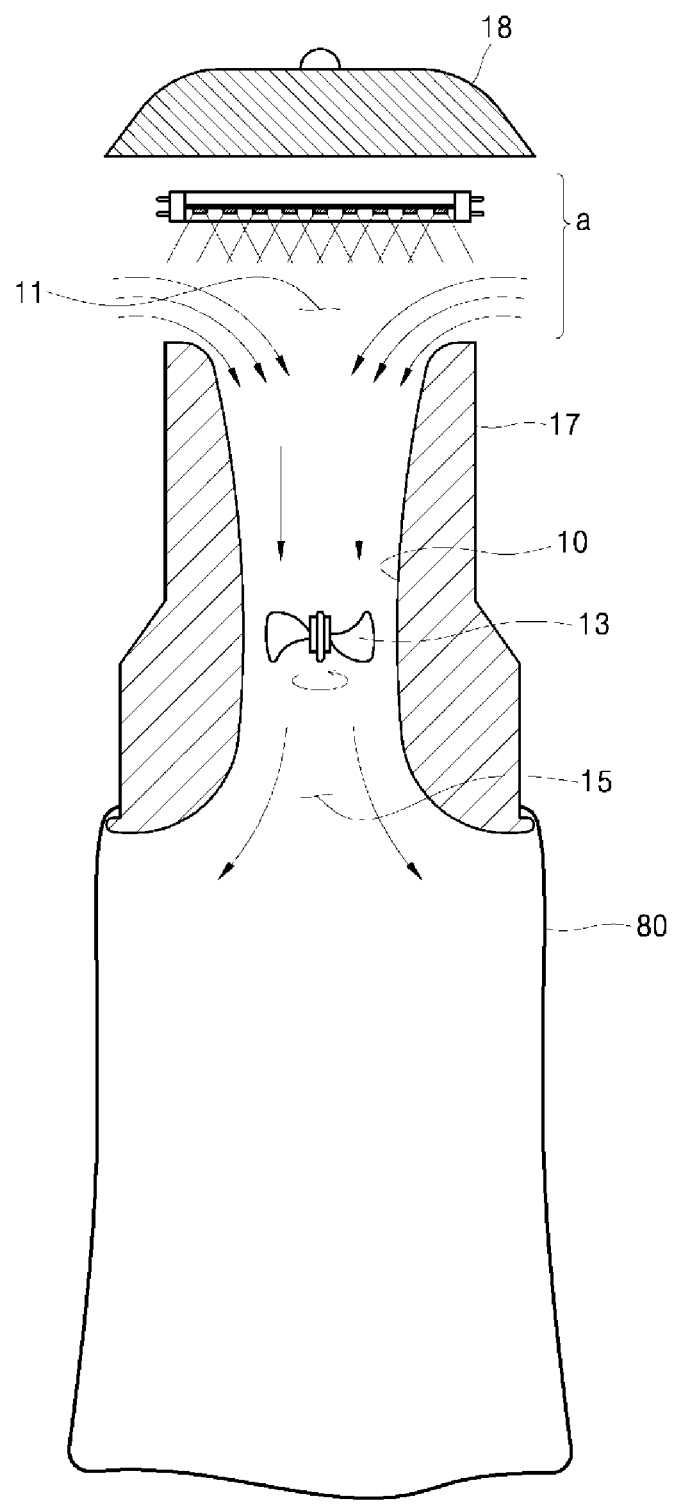
FIG. 2 is a side cross-sectional view of an insect trap according to the first embodiment of the present disclosure.
Figure 3:
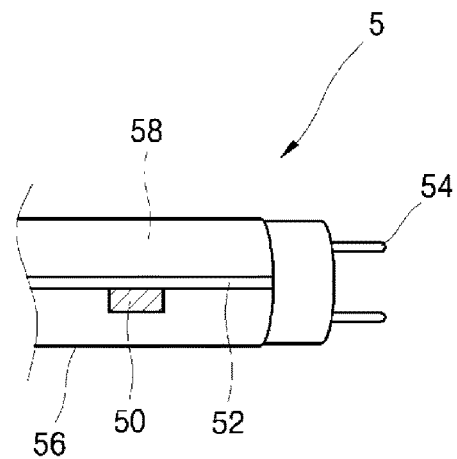
FIG. 3 is an enlarged view of a portion of a UV LED lamp used in an insect trap of the present disclosure.

FIG. 1 is a side view of an insect trap according to the present disclosure, FIG. 2 is a side cross-sectional view of the insect trap according to the present disclosure, and FIG. 3 is an enlarged view of a portion of a UV LED lamp used in the insect trap of the present disclosure.

The insect trap of the present disclosure includes a second housing 18 formed in a cover shape at the top of the insect trap, a first housing 17 disposed below the second housing 18 so as to be spaced apart therefrom, and a plurality of elongate connecting members 16 configured to fix the second housing 18 and the first housing 17 to each other in a spaced state.

A lamp support unit 19 is disposed at the bottom of the second housing 18, and a UV LED lamp S is supported thereby and is electrically connected to a power source. As shown in FIG. 2, the UV LED lamp 5 supported by the lamp support unit 19 is located in the spacing "a" between the first housing 17 and the second housing 18 so as to be closer to the second housing 18.

In the first housing 17, a duct 10 is formed vertically, and in the duct 10, a suction fan 13 configured to suck air along the lengthwise direction of the duct 10 is disposed. Thus, as the suction fan 13 rotates, air is sucked from an air inlet 11 to an air outlet 15.

In the lower portion of the first housing 17, there is provided a trapping portion 80 capable of trapping insects sucked together with air by the suction fan 13. The trapping portion 80 includes a net so that air sucked by the suction fan 13 is easily removed from the trapping portion 80 so that no pressure rising occurs in the trapping portion 80, while insects do not come out of the trapping portion 80.

The UV LED lamp 5 includes UV LED chips 50 mounted on a printed circuit board (PCB) 52 having a long flat plate shape. A plurality (for example, about eight) of UV LED chips 5 are disposed on one side of the PCB 522 so as to be spaced apart from one another along the lengthwise direction of the PCB 52. On the other side of the PCB 52, there is disposed a heat-dissipating pin 58 serving to dissipate the heat generated in the UV LED chip, and at the UV LED chip side, there is provided a transparent housing 56 made of a material that allows UV light to readily pass therethrough. In addition, on both ends of the UV LED lamp, there is disposed a terminal 54 that is connected to the power terminal of the lamp support unit 19 in order to supply power to the PCB 52.

The plurality of UV LED chips 50 disposed on the PCB 52 are configured to have a peak at substantially the same wavelength. In this case, the height of the peak at the wavelength becomes higher while the width of the peak is not increased, and thus the UV LED chips can emit very strong UV light in a specific wavelength range.

The UV LED lamp 5 of the present disclosure is disposed in the air inlet portion of the duct so that UV light emitted from the UV LED chips 50 is directed toward the inside of the duct 10. Thus, UV light emitted from the UV LED lamp is concentrated toward the inside of the duct 10, unlike a conventional black light (BL) lamp. For this concentration, the diffusion angle of UV light that is emitted from the UV LED chip is preferably limited to 120° or less.

When an insect trap having the UV LED lamp is configured as described above, the point light source will irradiate UV light concentrically toward the duct, and thus the intensity of the UV light will become stronger, and insects located far apart from the UV LED lamp will be attracted to a region below the UV LED lamp. Meanwhile, as shown in FIG. 2, the flow of air occurs in the air inlet 11, and this flow of air is stronger as it is closer to the first housing 17 than to the second housing 18 in the spacing "a" between the two housings. Thus, when the UV LED lamp disposed closer to the second housing 18 is configured to irradiate UV light toward the first housing 17, insects will be attracted concentrically to a space below the UV LED lamp and sucked securely into the trapping portion by the strong flow of air.

In addition, the UV LED lamp according to the present disclosure, has a point light source that illuminates the duct 10, particularly the suction fan 13. The high-speed rotation of the suction fan 13 influences the form of UV light passing through the suction fan 13 so that UV light illuminated into the trapping portion 80 below the suction fan 13 is very dynamically illuminated to insects located far apart from the insect trap, thereby attracting the insects close to the insect trap. Also, the insects that came close to the insect trap are attracted to a space below the UV LED lamp and trapped in the trap, in which stronger UV light is present, as described above.

The following shows the results of performing insect trapping experiments using the insect trap using the UV LED lamp according to the present disclosure and an insect trap using a conventional black light (BL) lamp under the same conditions.

The specifications of the two lamps are shown in Table 1 below.

TABLE 1

| | Voltage [V] | Current (Amps [A]) | Power (Watt [W]) | PF | Wp [nm] Peak wavelength | Fw [nm] Spectrum half-width | Φe [mW] Radiant flux | Φv [lm] |
|---|---|---|---|---|---|---|---|---|
| UV LED lamp | 220.1 | 0.034 | 4.98 | 0.66 | 367.94 | 9.24 | 759.19 | 5.7 |
| Black light lamp | 220.1 | 0.247 | 6.4 | 0.12 | 365.88 | 18.36 | 528.8 | 8.37 |

As can be seen in Table 1 above, the two lamps have similar peak wavelengths (about 365 nm), but the spectrum half-width of the UV LED lamp is only the half of that of the BL lamp, and the intensity of UV light versus visible light is 133 mW/lm for the UV LED lamp, which is at least two times greater than 63 mW/lm for the BL lamp.

Using these insect traps, an experiment was performed twice in an outdoor stall, and the number of individuals, which were attracted and trapped overnight (trap index), is shown in Table 2 below.

TABLE 2

| Species | Common name (vector disease) | Trap index B/L | Trap index LED | % Mean ratio (S.D.) B/L | % Mean ratio (S.D.) LED |
|---|---|---|---|---|---|
| *Aedes vexans* | *Aedes vexans* (west nile fever) | 1 0 | 7 0 | 12.5 (—) | 87.5 (—) |

TABLE 2-continued

| Species | Common name (vector disease) | Trap index B/L | Trap index LED | % Mean ratio (S.D.) B/L | % Mean ratio (S.D.) LED |
|---|---|---|---|---|---|
| Anopheles sinensis | Anopheles sinensis (malaria) | 296 | 1,028 | 16.8b[2)] | 83.2a |
| | | 316 | 2,500 | (7.9) | (7.9) |
| Culex pipiens | Culex pipiens (west nile fever) | 118 | 497 | 17.8b | 82.2a |
| | | 104 | 536 | (2.1) | (2.1) |
| Cx. tritaeniorhynchus | Cx. tritaeniorhynchus (J. encephalitis) | 687 | 3,307 | 14.8b | 85.2a |
| | | 452 | 3,196 | (3.4) | (3.4) |
| Mansonia uniforms | Mansonia uniforms | 145 | 269 | 26.5b | 73.5a |
| | | 80 | 368 | (12.1) | (12.1) |
| Total | | 1,247 | 5,108 | 16.1b | 83.9a |
| | | 952 | 6,600 | (4.9) | (4.9) |

As can be seen from the experimental results in Table 2 above, the use of the insect trap according to the present disclosure shows insect trapping efficiency that is at least 5 times higher than that of the use of the conventional BL lamp insect trap.

This result is because the e/v value of the UV LED lamp is greater than that of the BL lamp, and/or the half-width of the peak of the UV LED lamp is smaller than that of the BL lamp, and thus UV light is concentrated on a peak at a specific wavelength.

Since the target of above experiment was mosquitoes, the result of the experiment is reliable at least for mosquitoes.

2nd Embodiment

Figure 4:
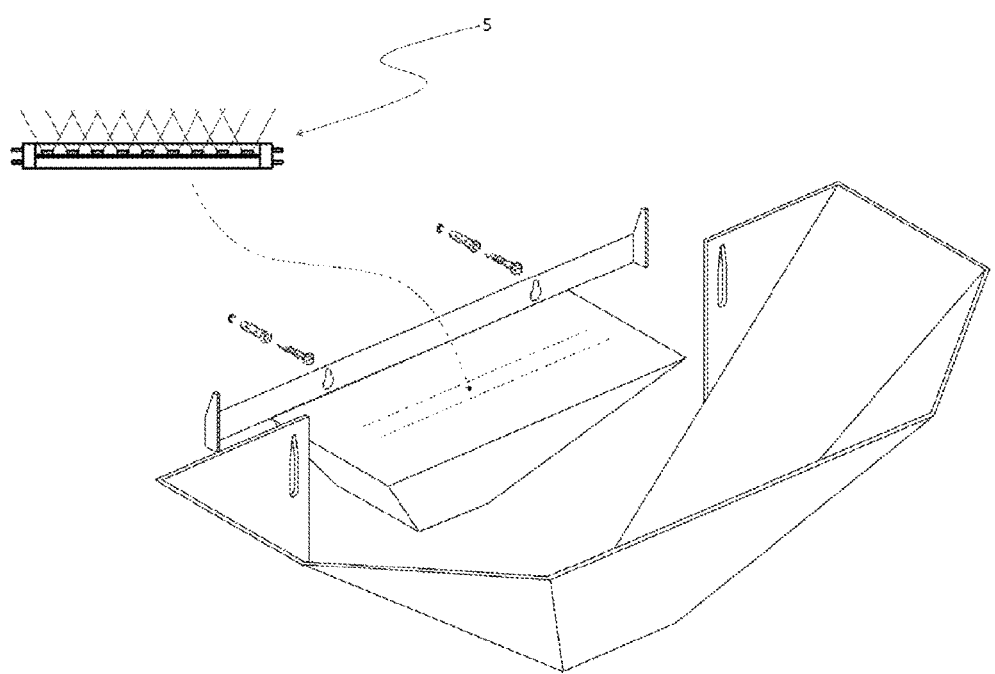
FIG. 4 is a perspective view of an insect trap according to the second embodiment of the present invention.

FIG. 4 is a perspective view of an insect trap according to the second embodiment of the present invention. The insect trap shown in FIG. 4 is a product named Luralite made by P & L Systems Ltd. The same UV LE D lamp as the first embodiment is used for the second embodiment. The UV LED lamp is installed so as to emit UV light upwardly as seen in FIG. 4. UV light does not have to be emitted upwardly, but it is desirable that the UV LED lamp is installed so as not to emit the UV light directly toward human bodies in the living space.

The experiments are performed in the cases that radiant flux of the UV LED lamps are different, that UV light is uniformly surface-emitted from the housing of the UV LED lamp roughened by sand blast process or is spot-emitted directly from the chips of the UV LED lamp, and that the wavelength of the UV LED lamps are different.

Experiment 1

The 1st experiment is attractant competition between 500 mW and 1,000 mW of radiant flux for uniformalized 365 nm LED UV lights using Luralite traps against house flies (*Musca domestica*) in a dark laboratory condition.

House fly collection rates were compared between 500 mW and 1,000 mW with uniformalized 365 nm LED UV lights using Luralite traps against 50 *Musca domestica*. The experiment site was a screened enclosure (1.8×3.7×1.8 m) in a dark laboratory. The experiments were conducted the paired tests in simultaneous exposure conditions for 1, 2, 4, 8, and 12 hours from the morning, Room Temp.: 27±1° C., RH: 64±4%, 2 replicates.

The collection rates of 1,000 mW for uniformalized 365 nm LED UV lights were significantly higher than those of 500 mW against house flies at 8 and 12 hour exposure periods (see Table 1). As a result, 1,000 mW radiant flux for uniformalized 365 nm LED UV lights was more effective than 500 mW for house fly light traps.

TABLE 3

Comparisons of collection rates between 500 mW and 1.000 mW radiant flux for uniformalized 365 nm UV LED light using Luralite fry traps against 50 *Musca domestica* in a screened enclosure in a dark condition for 12 hours from the morning, four replicates.

| Exposure Period (hr) | Cumulative % Mean Collection (S.D) | | |
|---|---|---|---|
| | 500 mW | 1,000 mW | Total |
| 1 | 18.0 ± 10.1a[1)] | 23.5 ± 2.5a | 41.5 ± 10.0 |
| 2 | 25.0 ± 9.5a | 37.0 ± 7.7a | 62.0 ± 11.0 |
| 4 | 32.5 ± 9.0a | 50.0 ± 9.4a | 82.5 ± 3.8 |
| 8 | 33.5 ± 8.7b | 64.0 ± 7.8a | 97.5 ± 3.0 |
| 12 | 34.0 ± 7.8b | 66.0 ± 7.8a | 100.0 ± 0.0 |

[1)]Means in the same rows followed by the same letter are not significantly different ($p > 0.05$; paired t-test using SPSS PC software).

Experiment 2

The 2nd experiment is attractant competition between 500 mW and 1,000 mW of radiant flux f or direct 365 nm LED UV Lights using Luralite traps against house flies (*Musca domestica*) in a dark laboratory condition.

House fly collection rates were compared between 500 mW and 1,000 mW with direct (not uniformalized) 36 S nm LED UV lights using Luralite traps against SO *Musca domestica*. The experiment site was a screened enclosure (1.8×3.7×1.8 m) in a dark laboratory. The experiments were conducted the paired tests in simultaneous exposure conditions for 1, 2, 4, 8, and 12 hours from the morning, Room Temp.: 27±1° C., RH: 64±4%, 4 replicates.

The collection rates of 1,000 mW for direct (not uniformalized) 36S nm LED UV lights were significantly higher than those of 500 mW against house flies at all exposure periods (Table 2). As a result, 1,000 mW radiant flux for direct (not uniformalized) 36S nm LED UV lights was more effective than 500 mW for house fly light traps.

TABLE 4

Comparisons of collection rates between 500 mW and 1,000 mW radiant flux for direct (not uniformalized) 365 nm UV LED light using Luralite fry traps against 50 *Musca domestica* in a screened enclosure in a dark condition for 12 hours from the morning, four replicates.

| Exposure Period (hr) | Cumulative % Mean Collection (S.D) | | |
|---|---|---|---|
| | 500 mW | 1,000 mW | Total |
| 1 | 7.5 ± 3.4b[1] | 18.0 ± 3.7a | 25.5 ± 6.4 |
| 2 | 14.0 ± 4.3b | 26.0 ± 2.3a | 10.0 ± 4.3 |
| 4 | 18.0 ± 3.7b | 45.0 ± 3.8a | 63.0 ± 5.3 |
| 8 | 28.5 ± 5.7b | 60.5 ± 8.7a | 89.0 ± 6.0 |
| 12 | 30.0 ± 4.3b | 70.0 ± 4.3a | 100.0 ± 0.0 |

[1]Means in the same rows followed by the same letter are not significantly different ($p > 0.05$; paired t-test using SPSS PC software).

Experiment 3

The 3rd experiment is attractant competition between direct (not uniformalized) and uniformalized UV lights of 365 nm LED at 1,000 mW using Luralite traps against house flies (*Musca domestica*) in a dark laboratory condition.

House fly collection rates were compared between direct (not uniformalized) and uniformalized UV lights at 365 nm LED of both 1,000 mW radiant flux using Luralite traps against 50 *Musca domestica*. The experiment site was a screened enclosure (1.8×3.7×1.8 m) in a dark laboratory. The experiments were conducted the paired tests in simultaneous exposure conditions for 1, 2, 4, 8, and 12 hours from the morning, Room Temp.: 26±1° C., RH: 62±4%, 4 replicates.

The collection rates of uniformalized 365 nm LED UV lights were significantly higher than those of direct (not uniformalized) lights against house flies on 2, 4, 8, and 12 hour exposure periods (Table 3). As a result, uniformalized 365 nm LED UV lights at 1,000 mW effected more for house fly light traps than direct (not uniformalized) 365 nm LED UV lights.

TABLE 5

Comparisons of collection rates between direct (not uniformalized) and uniformalized 365 nm UV LED light in 1,000 mW using Luralite fry traps against 50 *Musca domestica* in a screened enclosure in a dark condition for 12 hours from the morning, four replicates.

| Exposure Period (hr) | Cumulative % Mean Collection (S.D) | | |
|---|---|---|---|
| | Not Uniformalized | Uniformalized | Total |
| 1 | 3.0 ± 1.2a[1] | 7.0 ± 2.6a | 10.0 ± 2.3 |
| 2 | 6.5 ± 4.1b | 29.5 ± 12.8a | 36.0 ± 12.8 |
| 4 | 15.0 ± 8.4b | 52.0 ± 10.5a | 67.0 ± 9.0 |
| 8 | 22.0 ± 8.5b | 76.0 ± 10.3a | 98.0 ± 2.8 |
| 12 | 22.5 ± 9.1b | 77.5 ± 9.1a | 100.0 ± 0.0 |

[1]Means in the same rows followed by the same letter are not significantly different ($p > 0.05$; paired t-test using SPSS PC software).

Experiment 4

The 4th experiment is attractant competition between 340 nm and 365 nm of UV LED lights using Luralite traps against house flies (*Musca domestica*) in a dark laboratory condition.

At first, house fly collection rates were compared between 340 nm and 365 nm at both 500 mW of electrical power with uniformalized LED lights using Luralite traps against 50 *Musca domestica*. The experimental site was a screened enclosure (1.8×3.7×1.8 m) in a dark laboratory. The experiments were conducted the paired tests in simultaneous exposure conditions for 1, 2, 4, 8, and 12 hours from the morning, Room Temp.: 26±1° C., RH: 64±4%.

Next, house fly collection rates were compared between 340 nm at 500 mW and 365 nm at 1,000 mW of radiant flux with uniformalized LED lights using Luralite traps against 50 *Musca domestica*. The experimental site was the same with the previous described enclosure. The experiments were conducted the paired tests in simultaneous exposure conditions for 1, 2, 4, 8, and 12 hours from the morning, Room Temp.: 26±1° C., RH: 64±4%.

The collection rates of 365 nm LED UV lights were significantly higher than those of 340 nm LED UV at both 500 mW against house flies at 8 and 12 hours (Table 4-1). The collection rates of 365 nm LED UV lights at 1,000 mW were significantly higher than those of 340 nm LED UV at 500 mW against house flies at 4, 8, and 12 hours (Table 4-2) As a result, 365 nm LED UV lights was more effective than 365 nm LED UV lights for house fly light traps.

Comparisons of collection rates between 340 nm and 36S nm at both 500 mW radiant flux with uniformalized LED lights using Luralite fly traps against 50 *Musca domestica* in a screened enclosure in a dark condition for 12 hours from the morning, two replicates.

| Exposure Period (hr) | Cumulative % Mean Collection (S.D) | | |
|---|---|---|---|
| | 365 nm | 340 nm | Total |
| 1 | 11.0 ± 1.4a[1] | 3.0 ± 1.4a | 14.0 ± 0.0 |
| 2 | 23.0 ± 4.2a | 5.0 ± 1.4a | 28.0 ± 2.8 |
| 4 | 56.0 ± 5.7a | 11.0 ± 1.4a | 67.0 ± 4.2 |
| 8 | 79.0 ± 7.1a | 14.0 ± 0.0b | 93.0 ± 7.1 |
| 12 | 84.0 ± 2.8a | 16.0 ± 2.8b | 100.0 ± 0.0 |

[1]Means in the same rows followed by the same letter are not significantly different ($p > 0.05$; paired t-test using SPSS PC software).

TABLE 6-2

Comparisons of collection rates between 340 nm at 500 mW and 365 nm at 1,000 mW of radiant flux with uniformalized LED lights using Luralite fly traps against 50 *Musca domestica* in a screened enclosure in a dark condition for 12 hours from the morning, two replicates.

| Exposure Period (hr) | Cumulative % Mean Collection (S.D) | | |
|---|---|---|---|
| | 365 nm | 340 nm | Total |
| 1 | 16.0 ± 2.8a[1] | 4.0 ± 0.0a | 20.0 ± 2.8 |
| 2 | 29.0 ± 7.1a | 7.0 ± 1.4a | 36.0 ± 8.5 |
| 4 | 60.0 ± 2.8a | 11.0 ± 1.4b | 71.0 ± 4.2 |
| 8 | 85.0 ± 1.4a | 13.0 ± 1.4b | 98.0 ± 0.0 |
| 12 | 87.0 ± 1.4a | 13.0 ± 1.4b | 100.0 ± 0.0 |

[1]Means in the same rows followed by the same letter are not significantly different ($p > 0.05$; paired t-test using SPSS PC software).

Experiment 5

The 5th experiment is Attractant Effect of 365 nm uniformalized LED UV lights of 1,000 mW using a Luralite trap against house flies (*Musca domestica*) in a dark laboratory condition.

House fly collection rates were evaluated 365 nm at 1,000 mW of electrical power with uniformalized LED lights using Luralite traps against 50 *Musca domestica*. The experimental site was a screened enclosure (1.8×3.7×1.8 m) in a dark laboratory for 1, 2, 4, 8, and 12 hours from the morning, Room Temp.: 2 6±1° C., RH: 64±4%.

The collection rates of uniformalized 365 nm LED UV lights at 1,000 mW were very high such as 58.5%, 88.5%, and 100.0% after 4, 8, and 12 hour exposures, respectively (Table 5).

Collection rates (%) of 1,000 mW electrical power of uniformalized 365 nm UV LED light using Luralite trap against 50 *Musca domestica* in a screened enclosure in a dark condition for 1, 2, 4, 8 and 12 hour exposure periods from 9:00, four replicates.

| Replicate | Exposure Period (hr) | | | | |
|---|---|---|---|---|---|
| number | 1 | 2 | 4 | 8 | 12 |
| #1 | 10.0 | 32.0 | 68.0 | 96.0 | 100.0 |
| #2 | 6.0 | 24.0 | 52.0 | 86.0 | 100.0 |
| #3 | 8.0 | 28.0 | 60.0 | 90.0 | 100.0 |
| #4 | 8.0 | 26.0 | 54.0 | 82.0 | 100.0 |
| Mean | 8.0 | 27.5 | 58.5 | 88.5 | 100.0 |
| (S.D.) | (1.6) | (3.4) | (7.2) | (6.0) | (0.0) |

As can be seen from the experimental results of experiment 1 and experiment 2, fly collection rate is much higher in the condition that radiant flux is higher. As can be seen from the experimental results of experiment 3, UV light uniformly surface-emitted from the roughened surface has higher fly collection rate than that of UV light directly emitted from the UV led chips. As can be seen from the experimental results of experiment 4, UV light that has a peak wavelength of 365 nm has higher fly collection rate than that of UV light that has a peak wavelength of 340 nm.

As can be seen from the experimental results of these experiments, uniformly surface-emitted UV light that has higher radiant flux and peak wavelength of 365 nm has higher fly collection rate. It is more efficient when the radiant flux is near 1000 mW than 500 mW. But performance degradation would be caused by the high temperature when it is used for a long time, since too high radiant flux also makes too much heat compared with the limit of heat radiation efficiency. So it is important to limit the maximum radiant flux in order to avoid performance degradation due to heat. It is confirmed from additional experiments that UV light emitting efficiency does not decrease even if it is used for a long time when the radiant flux of the UV LED lamp is 750 mW to 1500 mW.

The fly collection efficiency of uniformly surface-emitted UV light that has 1,000 mW radiant flux and peak wavelength of 365 nm can be seen from the experimental results of experiment 5.

Meanwhile, the UV LED chip that is used in the insect trap of the present disclosure has the following structure having the effect of emitting UV light with high efficiency.

Figure 5:
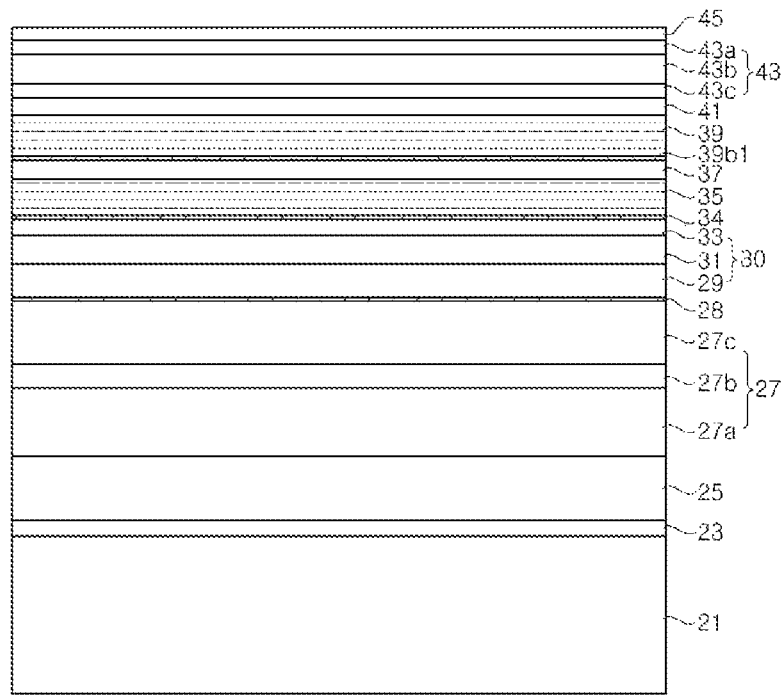
FIG. 5 is a cross-sectional view illustrating a UV LED chip according to an embodiment of the present disclosure.
Figure 6:
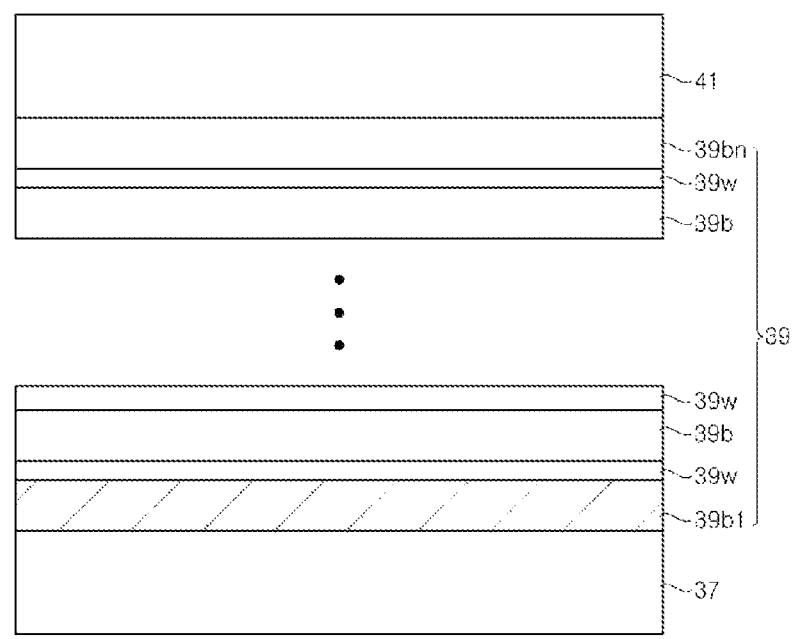
FIG. 6 is a cross-sectional view illustrating the multiple quantum well structure of a UV LED chip according to an embodiment of the present disclosure.

FIG. 5 is a cross-sectional view illustrating a UV LED chip according to an embodiment of the present disclosure, and FIG. 6 is an enlarged cross-sectional view illustrating the multiple quantum well structure of a UV LED chip according to an embodiment of the present disclosure.

Referring to FIG. 5, the UV LED chip includes an n-type contact layer 27, an electrostatic discharge preventing layer 30, a superlattice layer 35, an active region 39, a p-type contact layer 43, and electron control layers 28 and 34. In addition, the UV LED chip may further include a substrate 21, a nucleation layer 23, a buffer layer 25, an electron injection layer 37, an electron blocking layer 41 or a delta-doped layer 45.

The substrate 21 is a substrate on which a gallium nitride-based semiconductor layer is to be grown. It may be a sapphire, SiC or spinel substrate, etc., but is not specifically limited thereto. For example, it may be a patterned sapphire substrate (PSS).

The nucleation layer 23 may be formed of (Al, Ga)N at a temperature of 400-600° C. in order to allow the buffer layer 25 to grow on the substrate 21. For example, it is formed of GaN or AN. The nucleation layer may be formed to have a thickness of about 25 nm. The buffer layer 25 serves to suppress the occurrence of defects such as dislocation between the substrate 21 and the n-type contact layer 27, and is grown at a relatively high temperature. For example, the buffer layer 25 may be formed of undoped GaN to a thickness of about 1.5 μm.

The n-type contact layer 27 is formed of a gallium nitride-based semiconductor layer doped with an n-type impurity, for example, Si, and may be formed to have a thickness of, for example, about 3 μm. The n-type contact layer 27 may include an AlGaN layer or an AlInGaN layer, and may have a single layer or multi-layer structure. For example, as shown in the figure, the n-type contact layer 27 may include a lower GaN layer 27a, an intermediate layer 27b and an upper AlGaN layer 27c. Herein, the intermediate layer 27b may be formed of AlInN or may be formed to have a multi-layer structure (including a superlattice structure) composed of, for example, about 10 alternating layers of AlInN and GaN. The lower GaN layer 27a may be formed to have a thickness of about 1.5 μm, and the upper AlGaN layer 27c may be formed to have a thickness of about 1 μm. The upper AlGaN layer 27c may have an Al content of less than 10%, for example, about 9%.

The intermediate layer 27b is formed to have a thickness smaller than that of the upper AlGaN layer 27c, and may be formed to have a thickness of about 80 nm. The crystallinity of the upper AlGaN layer 27c can be increased by forming the intermediate layer 27b on the lower GaN layer 27a and forming the upper AlGaN layer 27c thereon.

In particular, a Si impurity is doped into the lower GaN layer 27a and the upper AlGaN layer 27c at a concentration of $1E18/cm^3$ or higher. The intermediate layer 27b may be doped to a level equal to or lower than that of the upper AlGaN layer 27c, and may not be intentionally doped with any impurity. Further, the upper AlGaN layer 27c may be formed of a modulation-doped layer by repeating doping and undoping.

The lower GaN layer 27a and the upper AlGaN layer 27c are doped with a high concentration of an impurity, and thus the resistance component of the n-type contact layer 27 can be reduced. An n-electrode 49a (see FIG. 8) that comes into contact with the n-type contact layer 27 may come into contact with the upper AlGaN layer 27c. Particularly, when a UV LED chip having a vertical structure is to be formed by removing the substrate 21, the lower GaN layer 27a and the intermediate layer 27b may also be removed.

The electron control layer 28 is placed on the n-type contact layer 27 so as to come into contact with the n-type contact layer 27. Particularly, the electron control layer 28 is placed on a layer that comes into contact with the n-electrode 49a, for example, the upper AlGaN layer 27c. The electron control layer 28 may have an Al content higher than that of the n-type contact layer 27, and may be formed of AlGaN or AlInGaN. For example, the Al content of the electron control layer 28 may range from 10% to 20%. The electron control layer 28 may be formed to have a thickness of about 1-10 nm.

The electron control layer 28 has an Al content higher than that of the n-type contact layer 27, and thus serves to interfere with the migration of electrons from the n-type contact layer 27 to the active region 39. Accordingly, the electron control layer 28 serves to control the mobility of electrons, thereby increasing the recombination rate of electrons and holes in the active region 39.

The electrostatic discharge preventing layer 30 is formed in order to improve the crystal quality of an epitaxial layer to be formed thereon. The electrostatic discharge preventing layer 30 may include an undoped AlGaN layer 29, a low-concentration AlGaN layer 31 and a high-concentration AlGaN layer 33. The undoped AlGaN layer 29 may be formed of intentionally undoped AlGaN, and may be formed to have a thickness smaller than that of the upper AlGaN layer 27c, for example, a thickness of 80 nm to 300 nm. As the n-type contact layer 27 is doped with an n-type impurity, residual stress is produced in the n-type contact layer 27, and the crystal quality is reduced. Also, as the electron control layer 28 having a relatively high Al content is formed, the crystal quality is reduced. For this reason, when another epitaxial layer is grown on the n-type contact layer 27 or the electron control layer 28, it will be difficult to form an epitaxial layer having good crystal quality. However, because the undoped AlGaN layer 29 is not doped with an impurity, it acts as a restoration layer that restores the reduced crystal quality of the n-type contact layer 27. Thus, in a preferred embodiment, when the electron control layer 28 is omitted, the undoped AlGaN layer 29 is formed directly on the n-type contact layer 27 so as to come into contact with the n-type contact layer 27, and when the electron control layer 28 is formed, the undoped AlGaN layer 29 is formed directly on the electron control layer 28 so as to come into contact with the electron control layer 28. In addition, because the undoped AlGaN layer 29 has a resistivity higher than that of the n-type contact layer 27, electrons that flow from the n-type contact layer 27 into the active layer 39 can be uniformly dispersed in the n-type contact layer 27 before they pass through the undoped AlGaN layer 29.

The low-concentration AlGaN layer 31 is placed on the undoped GaN layer 29, and has an n-type impurity doping concentration lower than that of the n-type contact layer 27. The low-concentration AlGaN layer 31 may have a Si doping concentration in the range of, for example, $5 \times 10^{17}/cm^3$ to $5 \times 10^{18}/cm^3$, and may be formed to have a thickness smaller than that of the undoped AlGaN layer 29, for example, a thickness of 50-150 nm. Meanwhile, the high-concentration AlGaN layer 33 is placed on the low-concentration AlGaN layer 31, and has an n-type impurity doping concentration higher than that of the low-concentration AlGaN layer 31. The high-concentration AlGaN layer 33 may have a Si doping concentration that is substantially similar to that of the n-type contact layer 27. The high-concentration AlGaN layer 33 may be formed to have a thickness smaller than that of the low-concentration AlGaN layer 31, for example, a concentration of about 30 nm.

The n-type contact layer 27, the electron control layer 28, the undoped AlGaN layer 29, the low-concentration AlGaN layer 31 and the high-concentration AlGaN layer 33 can be continuously grown by feeding metal gas sources into a chamber. As the metal gas sources, organic sources for aluminum (Al), gallium (Ga) and/or indium (In), for example, trimethyl aluminum (TMA), trimethyl gallium (TMG) and/or trimethyl indium (TMI), are used. Meanwhile, as a source gas for Si, SiH4 may be used. These layers may be grown at a first temperature, for example, 1050° C. to 1150° C.

The electron control layer 34 is placed on the electrostatic discharge preventing layer 30. Particularly, the electron control layer 34 is placed in contact with the high-concentration AlGaN layer 33. The electron control layer 34 has an Al content higher than that of the electrostatic discharge preventing layer 30, and may be formed of AlGaN or AlInGaN. For example, the Al content of the electron control layer 34 may range from 10% to 20%. The electron control layer 34 may be formed to have a thickness of about 1-10 nm.

Because the electron control layer 34 has an Al content higher than that of the electrostatic discharge preventing layer 30, it serves to interfere with the migration of electrons from the n-type contact layer 27 to the active layer 39. Thus, the electron control layer 34 functions to control the mobility of electron to thereby increase the recombination rate of electrons and holes in the active region 39.

The superlattice layer 35 is placed on the electron control layer 34. The super lattice layer 35 can be formed, for example, by depositing about 30 alternating layers of a first AlInGaN layer and a second AlInGaN layer, which have different compositions, in such a manner that each of the layers has a thickness of 20 Å. The first AlInGaN layer and the second AlInGaN layer have a band gap larger than that of well layers 39w (see FIG. 6) in the active region 39. The content of indium (In) in each of the first AlInGaN layer and the second AlInGaN layer may be lower than the content of indium (In) in the well layers 39w, but is not limited thereto, and at least one of the first AlInGaN layer and the second AlInGaN layer may have an In content higher than that of the well layers 39w. For example, the layer having a higher In content among the first AlInGaN layer and the second AlInGaN layer may have an In content of about 1% and an Al content of about 8%. The superlattice layer 35 may be formed of an undoped layer that is not intentionally doped with any impurity. Because the superlattice layer 35 is formed of an undoped layer, it can reduce the leakage current of the UV LED chip.

The superlattice layer 35 can act as a buffer layer for an epitaxial layer formed thereon, and thus improves the crystal quality of the epitaxial layer.

The electron injection layer 37 has an n-type impurity doping concentration higher than that of the superlattice layer 35. In addition, the electron injection layer 37 may have an n-type impurity doping concentration that is substantially equal to that of the n-type contact layer 27. For example, the n-type impurity doping concentration may range from $2 \times 10^{18}/cm^3$ to $2 \times 10^{19}/cm^3$, and preferably from $1 \times 10^{19}/cm^3$ to $2 \times 10^{19}/cm^3$. The electron injection layer 37 may be formed to have a thickness similar to or smaller than that of the high-concentration doped layer 33, for example, a thickness of about 20 nm. The electron injection layer 37 may be formed of, for example, AlGaN.

On the electron injection layer 37, the active region 39 is placed. FIG. 6 is an enlarged cross-sectional view of the active region 39.

Referring to FIG. 6, the active region 39 has a multiple quantum well structure including barrier layers 39b deposited alternately with well layers 39w. The well layers 39w may have a composition that emits near ultraviolet light at a wavelength ranging from 360 nm to 390 nm. For example, the well layers 39w may be formed of GaN, InGaN or AlInGaN. Particularly, it may be formed of InGaN. Herein, the content of indium (In) in the well layers 39w is determined according to the required wavelength of near ultraviolet light. For example, the In content of the well layers 39w may be about 1% or less. The well layers may be formed to have a thickness of about 20-30 Å.

The barrier layers 39b may be formed of a gallium nitride-based semiconductor layer, for example, GaN, InGaN, AlGaN or AlInGaN, which has a band gap larger than that of the well layers. Particularly, the barriers layer may be formed of AlInGaN including In, and thus the lattice mismatch between the well layer 39w and the barrier layer 39b can be reduced.

Meanwhile, among the battier layers 39b1, 39b and 39bn, the first barrier layer 39b1 located closest to the electron injection layer 37 or the superlattice layer 35 may have an Al content higher than those of the other barrier layers. For example, the Al content of the first barrier layer 39b1 may be higher than those of the other barrier layers 39b by at least 5%, at least 10% or at least 20%. The Al content of the first barrier layer 39b1 may, for example, range from 30% to 50%. For example, the other barrier layers 39b and 39bn may have an Al content of about 20%, and the first barrier layer 39b1 may have an Al content of about 40%. The content of In in these barrier layers 39b1, 39b and 39bn is about 1% or less.

Generally, barrier layers in UV LED chips are formed to have the same composition. However, in this embodiment, the first barrier layer 39b1 has a higher Al content compared to other barrier layers 39b. Because the first barrier layer 39b1 is formed to have a higher band gap compared to other barrier layers 39b, the first barrier layer 39b1 can function to trap carriers in the active region 39. In addition, the first barrier layer 39b1 has an Al content higher than that of the 3 superlattice layer 35 or the electron injection layer 37, and thus can function as an electron control layer that interferes with the flow of electrons.

Meanwhile, the first barrier layer preferably has a thickness that is substantially equal to those of barrier layers other than the last barrier layer located closest to an electron blocking layer 41 or a p-type contact layer 43. The first barrier layer may have a thickness of, for example, 40-60 Å, particularly about 50 Å.

The active region 39 may come into contact with the electron injection layer 37. Particularly, the first barrier layer 39b1 comes into contact with the electron injection layer 37 so as to effectively delay the flow of electrons. Meanwhile, the barrier layers and quantum well layers of the active region 39 may be formed of undoped layers that are not doped with any impurity in order to improve the crystal quality of the active region, but a portion or the whole of the active region may also be doped with an impurity in order to lower the forward voltage.

Referring to FIG. 5 again, a p-type contact layer 43 may be placed over the active region 39, and an electron blocking layer 41 may be disposed between the active region 39 and the p-type contact layer 43. The electron blocking layer 41 may be formed of AlGaN or AlInGaN. If the electron blocking layer 41 is formed of AlInGaN, its lattice mismatch with the active region 39 can further be reduced. Herein, the electron blocking layer 41 may have an Al content of, for example, about 40%. The electron blocking layer 41 may be doped with a p-type impurity, for example, Mg, but may not be intentionally doped with any impurity. The electron blocking layer 41 may be formed to have a thickness of about 15 nm.

The p-type contact layer 43 may be formed of an Mg-doped AlGaN layer or AlInGaN layer, and may, for example, have an Al content of about 8% and a thickness of 100 nm. The p-type contact layer 43 may be formed of a single layer, but is not limited thereto, and as shown in the figure, may include a lower high-concentration doped layer 43a, a low-concentration doped layer 43b and an upper high-concentration doped layer 43c. The low-concentration doped layer 43b has a doping concentration lower than those of the lower and lower high-concentration doped layer 43a and 43c, and is disposed between the lower high-concentration doped layer 43a and the upper high-concentration doped layer 43c. The low-concentration doped layer 43b can be grown while the feed of an MG source gas (e.g., Cp2Mg) is blocked during growth. In addition, during the growth of the low-concentration doped layer 43b, H2 gas may be excluded, and N2 gas may be used as a carrier gas in order to reduce the impurity content of the layer. Also, the low-concentration doped layer 43b may be formed thicker than the lower and upper high-concentration doped layers 43a and 43c. For example, the low-concentration doped layer 43b may be formed to have a thickness of about 60 nm, and each of the lower and upper high-concentration doped layers 43a and 43c may be formed to have a thickness of 10 nm. Accordingly, the loss of near ultraviolet light by the p-type contact layer 43 can be prevented or reduced by improving the crystal quality of the p-type contact layer 43 and reducing the impurity concentration of the p-type contact layer 43.

Meanwhile, a delta-doped layer 45 may be placed on the p-type contact layer 43 to lower the ohmic contact resistance. The delta-doped layer 45 is doped with a high-concentration n-type or p-type impurity in order to lower the ohmic contact resistance between an electrode formed thereon and the p-type contact layer 43. The delta-doped layer 45 may be formed to have a thickness of about 2-5 Å.

Figure 7:
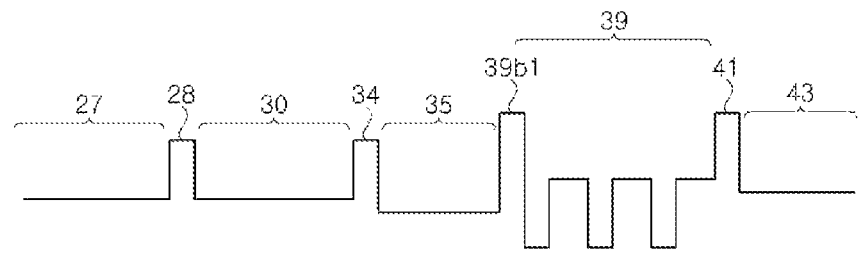
FIG. 7 is a schematic band diagram illustrating an energy band gap according to an embodiment of the present disclosure.

FIG. 7 is a schematic band diagram illustrating an energy band gap according to an embodiment of the present disclosure. For simplicity of illustration, FIG. 7 schematically shows only a conduction band.

Referring to FIG. 7, an electrode control layer 28 is placed between an n-type contact layer 27 and an electrostatic discharge preventing layer 30, and an electron control layer 34 is placed between the electrostatic discharge preventing layer 30 and a superlattice layer 35. Also, a first barrier layer 39b1 in an active layer 39 is located closer to the super lattice layer 35 than to the well layers or other barrier layers of the active region 39. The electron control layers 28 and 34 have a band gap larger than those of the layers adjacent thereto, and thus acts as a barrier against the migration of electrons from the n-type contact layer 27 to the active region 39. Particularly, the electron control layer 28 has a band gap larger than that of the n-type contact layer 27, and the electron control layer 34 has a band gap larger than that of the electrostatic discharge preventing layer 30. The first barrier layer 39b1 also has a band gap larger than that of the superlattice layer 35 or the electron injection layer 37, and thus acts as a barrier for electrons that are injected from the superlattice layer 35 into the active region 39.

As shown in FIG. 7, the electron control layers 28 and 34 together with the first barrier layer 39b1 may be disposed between the n-type contact layer 27 and the active region 39, thereby delaying the flow of electrons. Thus, electrons can be prevented from deviating from the active region 39 without being recombined with holes, thereby increasing the recombination rate of electrons and holes. A light-emitting diode adopting the electron control layers 28 and 34 will show better effects when it operates at high current densities.

Figure 8:
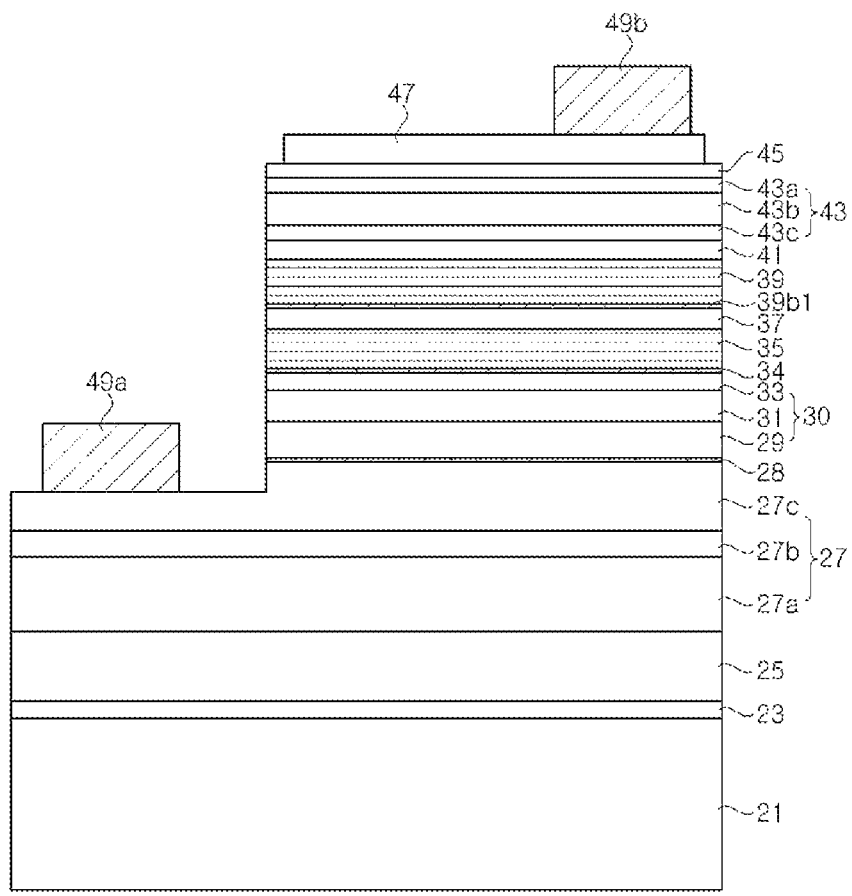
FIG. 8 is a schematic cross-sectional view illustrating a UV LED chip having electrodes according to an embodiment of the present disclosure.

FIG. 8 is a schematic cross-sectional view illustrating a UV LED chip having electrodes according to an embodiment of the present disclosure. FIG. 8 shows a UV LED chip having a horizontal structure, fabricated by patterning the epitaxial layers grown on a substrate 21.

Referring to FIG. 8, the UV LED chip includes, in addition to the substrate and epitaxial layers described with reference to FIG. 5, a transparent electrode 47, an n-electrode 49a and a p-electrode 49b.

The transparent electrode 47 may be formed of, for example, indium tin oxide (ITO). The p-electrode 49b is formed on the transparent electrode 47. Meanwhile, the n-electrode 49a comes into contact with the n-type contact layer 27, particularly the upper AlGaN layer 27c, exposed by etching the epitaxial layers. The electron control layer 28 is placed on the n-type contact layer 27 with which the n-electrode 49a comes into contact, so as to interfere with the flow of electrons from the n-type contact layer 27 to the active region 39.

Although the UV LED chip having the horizontal structure has been shown and described in this embodiment, the scope of the present disclosure is not limited to the UV LED chip having the horizontal structure. A UV LED chip having a flip chip structure can be fabricated by patterning the epitaxial layers grown on the substrate 21. Alternatively, a UV LED chip having a vertical structure can also be fabricated by removing the substrate 21. Experimental Examples Epitaxial layers as shown in FIG. 5 were grown on a patterned sapphire substrate using a metal-organic chemical vapor deposition (MOCVD) system under the same conditions while changing only the conditions for formation of the electron control layers 28 and 34. UV LED chips of Example 1 were samples in which the electron control layers 28 and 34 were not formed, and a first barrier layer in the samples had a thickness of about 5 nm and an Al content of about 40%. Meanwhile, UV LED chips of Example 2, Example 3 and Example 4 were fabricated in the same manner as that of Example 1, except that the electron control layer 28 and the electron control layer 34 were formed. Each of the electron control layer 28 and the electron control layer 34 was formed to have a thickness of about 5 nm. Meanwhile, the electron control layers 28 and 34 in the UV LED chips of Examples 2 to 4 were formed to have Al contents of about 10% for Example 2, about 15% for Example 3, and about 20% for Example 4. The content of Al was measured using an atomic probe. Meanwhile, in each of the Examples, the content of Al in each of the n-type contact layer 27 and the electrostatic discharge preventing layer 33 was about 9%, and the content of Al in the superlattice layer 35 was about 8%.

Two wafers for each of Examples 1 to 3 were fabricated, and one wafer for Example 4 was fabricated. The light output of each of the UV LED chips was measured at the wafer level, and the mean light output value for each wafer is shown in FIG. 9.

Figure 9:
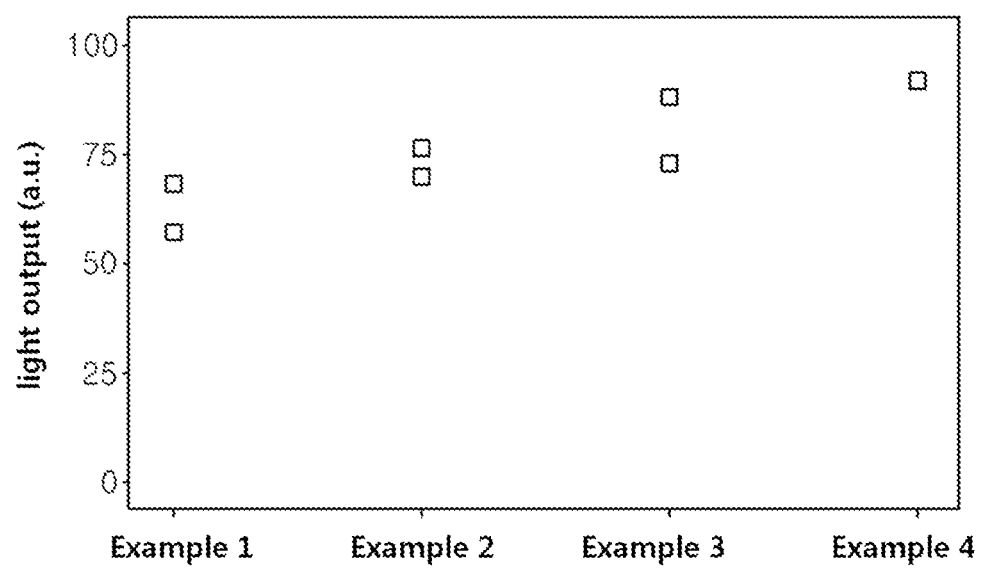
FIG. 9 is a graph showing the light outputs of UV LED chips according to embodiments of the present disclosure.

As can be seen in FIG. 9, the UV LED chips of Examples 2 and 3 having the electron control layers 28 and 34 formed thereon showed higher light outputs compared to the UV LED chip having no electron control chip. In addition, the light output increased as the Al content of the electron control layers 28 and 34 increased.

As described above, a UV LED lamp in an insect trap according to the present disclosure emits UV light, which is concentrated on a peak at a specific wavelength and is stronger than visible light, while the consumption of energy used is reduced. In addition, the insect trapping efficiency of the insect trap can be significantly increased due to the characteristics of the position and direction of the UV LED lamp provided in the insect trap.

While various embodiments have been described above, it will be understood to those skilled in the art that the embodiments described are by way of example only. Accordingly, the disclosure described herein should not be limited based on the described embodiments.

What is claimed is:

1. An insect trap comprising:
   a UV LED lamp including a printed circuit board (PCB) having a UV LED chip disposed on the PCB;
   a housing structured to install the UV LED lamp; and
   a trapping portion provided near the housing,
   wherein the UV LED chip comprises:
      an n-type contact layer including an AlGaN layer or an AlInGaN layer;
      a p-type contact layer including an AlGaN layer or an AlInGaN layer; and
      an active region located between the n-type contact layer and the p-type contact layer and including barrier layers and a well layer located between the barrier layers, and
   wherein the barrier layers include AlInGaN or AlGaN, and the well layer emits UV light.

2. The insect trap of claim 1, wherein the UV LED chip further includes at least one electron control layer located between the n-type contact layer and the active layer.

3. The insect trap of claim 2, wherein the at least one electron control layer includes AlInGaN or AlGaN, and has an Al content higher than the n-type contact layer to interfere with a flow of electrons moving from the n-type contact layer into the active region.

4. The insect trap of claim 1, wherein the UV LED chip further comprises:
   a superlattice layer located between the n-type contact layer and the active region; and
   an electron injection layer located between the superlattice layer and the active region, and
   wherein the electron injection layer has an n-type impurity doping concentration higher than that of the superlattice layer.

5. The insect trap of claim 4, wherein the UV LED chip further comprises:
   an electrostatic discharge preventing layer located between the n-type contact layer and the superlattice layer; and
   an electron control layer disposed between the electrostatic discharge preventing layer and the superlattice layer.

6. The insect trap of claim 5, wherein the electrostatic discharge preventing layer comprises:
   an undoped AlGaN layer;
   a low-concentration AlGaN layer doped with an n-type impurity at a concentration lower than that of the n-type contact layer; and
   and a high-concentration AlGaN layer doped with an n-type impurity at a concentration higher than that of the low-concentration AlGaN layer,
   wherein the low-concentration AlGaN layer is located between the undoped AlGaN layer and the high-concentration AlGaN layer.

7. The insect trap of claim 5, further comprising a first electron control layer disposed between the electrostatic discharge preventing layer and the superlattice layer and located to contact with the high concentration AlGaN layer.

8. The insect trap of claim 1, wherein the UV LED lamp has a flat plate shape.

9. The insect trap of claim 1, wherein the UV LED lamp includes an additional UV LED chip and the UV LED chip and the additional UV LED chip are spaced apart from each other.

10. The insect trap of claim 1, further includes a suction fan disposed between the housing and the trapping portion to create an airflow to facilitate UV illumination from the UV LED lamp toward the trapping portion.

11. An insect trap comprising:
a UV LED lamp including a printed circuit board (PCB) having a UV LED chip disposed on the PCB;
a housing structured to install the UV LED lamp; and
a trapping portion provided near the housing,
wherein the UV LED chip comprises:
an n-type contact layer including an AlGaN layer or an AlInGaN layer;
a p-type contact layer including an AlGaN layer or an AlInGaN layer;
an electron blocking layer located between the n-type contact layer and the p-type contact layer; and
an active region located between the n-type contact layer and the p-type contact layer; and including barrier layers and a well layer located between the barrier layers, and
wherein the barrier layers include AlInGaN or AlGaN, and the well layer emits UV light.

12. The insect trap of claim 11, wherein the electron blocking layer includes AlGaN or AlInGaN and be doped with a p-type impurity.

13. The insect trap of claim 12, wherein the p-type impurity includes Mg.

14. The insect trap of claim 11, wherein the well layer includes InGaN.

15. The insect trap of claim 11, wherein the UV light has a peak wavelength between 360 nm and 370 nm.

16. The insect trap of claim 11, wherein a diffusion angle of UV light emitted from the UV LED chip is 120° or less.

* * * * *